(12) United States Patent
Uchida et al.

(10) Patent No.: US 8,288,658 B2
(45) Date of Patent: Oct. 16, 2012

(54) MULTILAYER CIRCUIT BOARD AND MOTOR DRIVE CIRCUIT BOARD

(75) Inventors: Nobuhiro Uchida, Yamatotakada (JP); Motoo Nakai, Nara (JP); Hiroshi Sumasu, Kashihara (JP)

(73) Assignee: JTEKT Corporation, Osaka-shi (JP)

( * ) Notice: Subject to any disclaimer, the term of this patent is extended or adjusted under 35 U.S.C. 154(b) by 211 days.

(21) Appl. No.: 12/866,638

(22) PCT Filed: Feb. 5, 2009

(86) PCT No.: PCT/JP2009/051943
§ 371 (c)(1),
(2), (4) Date: Aug. 6, 2010

(87) PCT Pub. No.: WO2009/099131
PCT Pub. Date: Aug. 13, 2009

(65) Prior Publication Data
US 2011/0011633 A1   Jan. 20, 2011

(30) Foreign Application Priority Data
Feb. 7, 2008 (JP) .................................. 2008-028111

(51) Int. Cl.
*H05K 1/02* (2006.01)
*H05K 1/16* (2006.01)
(52) U.S. Cl. ........ 174/258; 174/252; 174/260; 361/715; 361/720; 361/767; 361/777; 361/780
(58) Field of Classification Search .......... 174/250–267; 361/760–767, 715, 720–724, 777–778, 793–795; 257/207, 210, 211, 662, 691, 698, 728, 758, 257/264; 318/138, 139, 245, 254, 293, 430–479
See application file for complete search history.

(56) References Cited

U.S. PATENT DOCUMENTS
6,078,155 A * 6/2000 Tominaga et al. ............ 318/293
(Continued)

FOREIGN PATENT DOCUMENTS
JP          4 310315          11/1992
(Continued)

OTHER PUBLICATIONS

Office Action issued Jul. 18, 2012 in Japanese Patent Application No. 2008-028111, filed Feb. 7, 2008 (with English-language Translation), 5 pages.

*Primary Examiner* — Michail V Datskovskiy
(74) *Attorney, Agent, or Firm* — Oblon, Spivak, McClelland, Maier & Neustadt, L.L.P.

(57) ABSTRACT

A multilayer circuit board in which wirings are arranged so that the inductance thereof is reduced. A ground wiring and a power source wiring which are provided in a multilayer circuit board are arranged so that most of the wirings are superposed vertically along a direction of a longer side of the circuit board, and since currents flow in an opposite direction to each other in the portions which are superposed, magnetic fields generated by the currents so flowing are canceled by each other. Similarly, a W-phase wiring, a V-phase wiring and a W-phase wiring are also arranged so that the wirings are partially superposed along their longer side direction vertically, and magnetic fields generated by currents flowing in the portions which are superposed vertically are canceled by one another. By this, the inductance of the wirings can be reduced by increasing a mutual inductance between these wirings.

5 Claims, 6 Drawing Sheets

U.S. PATENT DOCUMENTS

| | | | |
|---|---|---|---|
| 6,172,305 B1 * | 1/2001 | Tanahashi | 174/255 |
| 6,268,669 B1 | 7/2001 | Wakao et al. | |
| 6,380,617 B1 | 4/2002 | Sofue et al. | |
| 6,420,778 B1 * | 7/2002 | Sinyansky | 257/664 |
| 6,477,038 B2 * | 11/2002 | Iwasaki et al. | 361/679.02 |
| 2002/0015293 A1 * | 2/2002 | Akiba et al. | 361/793 |
| 2002/0060105 A1 | 5/2002 | Tominaga et al. | |
| 2003/0107056 A1 * | 6/2003 | Chin et al. | 257/211 |
| 2003/0173920 A1 * | 9/2003 | Tominaga et al. | 318/432 |
| 2007/0205038 A1 * | 9/2007 | Tominaga et al. | 180/444 |
| 2008/0266811 A1 * | 10/2008 | Yamada et al. | 361/720 |

FOREIGN PATENT DOCUMENTS

| | | |
|---|---|---|
| JP | 9 181407 | 7/1997 |
| JP | 11 152050 | 6/1999 |
| JP | 2000-091497 | 3/2000 |
| JP | 2000-183527 | 6/2000 |
| JP | 2002 44961 | 2/2002 |
| JP | 2002 120739 | 4/2002 |
| JP | 2002 345211 | 11/2002 |
| JP | 2005 64028 | 3/2005 |
| JP | 2006-216677 | 8/2006 |
| JP | 2007 27618 | 2/2007 |
| JP | 2007-335748 | 12/2007 |
| JP | 02008182184 A * | 8/2008 |
| WO | 99 16654 | 4/1999 |

* cited by examiner

MULTILAYER CIRCUIT BOARD AND MOTOR DRIVE CIRCUIT BOARD

TECHNICAL FIELD

The present invention relates to a multilayer circuit board and a motor drive circuit board for an electric power steering system which employs the multilayer circuit board.

BACKGROUND ART

In an electric power steering system for a vehicle, a steering assist motor is driven so as to obtain a preferred steering assist force in accordance with a steering torque given to a steering wheel by a driver and a vehicle speed.

The steering assist motor is driven by a motor drive circuit which is incorporated in an electronic control unit (hereinafter, referred to as ECU). The motor drive circuit controls large power of the order of 500 W to 2000 W when it drives the steering assist motor.

As this occurs, the motor drive circuit generates heat, in order to prevent erroneous operations or failure of the ECU due to the generated heat, the motor drive circuit is mounted on a circuit board having good heat conduction properties. As is shown in FIG. 10(a), for example, the motor drive circuit is mounted on a metallic circuit board in which one conductor layer 91 made of copper and one insulation layer 92 made of resin are formed one on top of the other on a metallic substrate 93 (a heat sink) made of aluminum.

Since electronic components can only be mounted on one side (specifically, on the conductor layer 91) of the circuit board shown in FIG. 10(a), an area occupied by this circuit board within the ECU becomes large. Then, as one of methods for reducing the substrate area, a method is considered in which a circuit board is fabricated with a multiplicity of layers, as is shown in FIG. 10(b). A ceramic multilayer substrate shown in FIG. 10(b) is such that copper conductor layers 91 and ceramic insulation layers 94 are laminated into a multilayer construction, which is then affixed to an aluminum metallic substrate 93 (a heat sink) with an adhesive 95. By adopting the multilayer construction, since the length of circuit conductors (the length of wirings) can be shortened, the inductance thereof can be suppressed to a lower level, thereby making it possible to suppress the generation of switching noise.

In relation to the invention of this patent application, the following related-art techniques are known. Patent Document 1 discloses an electric power steering system which includes a circuit case which is assembled to a heat sink while covering a power substrate including a switching element and in which the heat sink is assembled to a speed reduction mechanism. Patent Document 2 discloses an electric power steering system in which a power circuit board and a control circuit board are installed to be laminated one on top of the other in a circuit casing and the power circuit board is assembled closely to a bracket of a motor. These constructions eliminate wiring harnesses and connectors so as to reduce radiation noise. Further, Patent Document 3 discloses a configuration in which a substrate including a motor drive circuit and a control circuit is mounted on a motor case to thereby stabilize the operations of the circuits.

Patent Document 1: JP-A-2002-120739
Patent Document 2: JP-A-2002-345211
Patent Document 3: WO99/16654

PROBLEM THAT THE INVENTION IS TO SOLVE

As has been described above, although in the event that the length of circuit conductors (the length of wirings) is shortened by fabricating a substrate into a multilayer construction, the generation of switching noise can be suppressed, there may be a case in which the length of wirings becomes long depending upon a place where such a multilayer circuit board is mounted. For example, when a place where a circuit board is mounted is narrow and long, the length of a longer side of a substrate becomes much longer than the length of a shorter side thereof. As this occurs, since the inductance of a wiring which extends in the direction of the longer side increases, switching noise increases accordingly.

Then, an object of the invention is to provide a multilayer circuit board in which wirings are arranged so that the inductance is decrease, and a motor drive circuit board for an electric power steering system which employs the multilayer circuit board.

MEANS FOR SOLVING THE PROBLEM

According to a first invention, there is provided a multilayer circuit board including a plurality of conductor layers and a plurality of resin insulation layers which are laminated alternately, comprising: a first wiring formed on a first layer of the plurality of conductor layers; and a second wiring formed on a second layer of the plurality of conductor layers, wherein portions of the first wiring and the second wiring which face each other in a direction in which the plurality of conductor layers are laminated extend in parallel; and wherein the first wiring and the second wiring are arranged so as to weaken a magnetic field generated by a current which flows through the first wiring and a magnetic field generated by a current which flows through the second wiring to each other.

According to a second invention, there is provided a multilayer circuit board according to the first invention, the first wiring and the second wiring are a power source wiring and a ground wiring in which currents flow therethrough in an opposite direction to each other.

According to a third invention, there is provided a multilayer circuit board according to the first invention, further including a third wiring formed on a third layer of the plurality of conductor layers, wherein the first wiring, the second wiring and the third wiring are wirings which are respectively connected to phases of a multiphase motor provided outside.

According to a fourth invention, there is provided a multilayer circuit board according to any of the first to third inventions, further including a terminal which is provided in a vicinity of at least one of two short edges of four edges of a substrate surface which is configured by curved lines or straight lines, and is connected to at least one of the first wiring and the second wiring, wherein the portions of the first wiring and the second wiring which face each other extend along two long edges of the four edges.

According to a fifth invention, there is provided a motor drive circuit board for an electric power steering system comprising: a multilayer circuit board which includes a plurality of conductor layers and a plurality of resin insulation layers which are laminated alternately; a first wiring formed on a first layer of the plurality of conductor layers; and a second wiring formed on a second layer of the plurality of conductor layers, wherein portions of the first wiring and the second wiring which face each other in a direction in which the plurality of conductor layers are laminated extend in parallel; and wherein the first wiring and the second wiring are arranged so as to weaken a magnetic field generated by a current which flows through the first wiring and a magnetic field generated by a current which flows through the second wiring to each other.

ADVANTAGE OF THE INVENTION

According to the first invention, since the wirings are arranged so that the magnetic fields are canceled by each other, the inductance of the wirings can be made small. In addition, the switching noise that is generated thereby can be suppressed to a lower level. Further, since the inductance of the wirings is small, the substrate can be lengthened in the direction in which the wirings extend.

According to the second invention, the inductance of the power line and the ground line which generally extend long from the terminals can be made small.

According to the third invention, the inductance of at least the three wirings which generally extend long from the terminals to connect, respectively, to the phases of the multiphase motor can be made small.

According to the fourth invention, since the terminals are provided in the vicinity of at least one of the two shorter edges (typically, the shorter sides) of the main four edges (typically, the four sides) of the substrate surface, even in the event that a place where to accommodate the circuit board is narrow and long to extend along the two longer edges (typically, the longer sides) of the edges, the circuit board can easily be placed (accommodated) in the place in question without being interrupted by the wirings extending individually from the terminals.

According to the fifth invention, the advantage provided in the first invention can also be provided in the motor drive circuit board.

DESCRIPTION OF REFERENCE NUMERALS

10$u$ U-phase terminal; 10$v$ V-phase terminal; 10$w$ W-phase terminal; 11 W-phase wiring; 15$u$, 15$v$, 15$w$, 16$u$, 16$v$, 16$w$ MOSFET; 17 resistor; 20 ground terminal; 21 V-phase wiring; 22 ground wiring; 30 power source terminal; 31 U-phase terminal; 33 power source wiring; 100 multilayer circuit board; 101 first layer; 102 second layer; 103 third layer; 201 circuit conductor; 202 insulation layer; 203 metallic substrate; 204 heat sink; 205$a$, 205$b$ screw; 301 upper gear housing; 310 control circuit board; 311 heat dissipating through hole; 321 heat conduction sheet; 330 CPU; 401 non-contacting heat sink; 402 coating resin; 403 electronic circuit board; 404 heat sink; 405 bare chip.

BEST MODE FOR CARRYING OUT THE INVENTION

1. Configuration of Multilayer Circuit Board

A multilayer circuit board according to an embodiment of the invention is a motor drive circuit board for an electric power steering system, and this motor drive circuit board is incorporated for use in an ECU (Electronic Control Unit) for the electric power steering system.

This ECU includes a motor control circuit for calculating a quantity of drive current that is supplied to the steering assist motor and a motor drive circuit for controlling a large current to drive the steering assist motor. Although the heat value of the motor control circuit is small and the current which flows therethrough is small when the circuit operates, the heat value of the motor drive circuit is large and the current which flows therethrough is large when the circuit operates. The motor drive circuit is mounted on a motor drive circuit board, and the motor control circuit is mounted on a separate circuit board from the motor drive circuit board. These two circuit boards are disposed side by side or superposed one on top of the other into two stages in an interior of the ECU. Hereinafter, the construction of the multilayer circuit board, which is the motor drive circuit board, will be described by reference to FIGS. 1 to 3.

Figure 1:
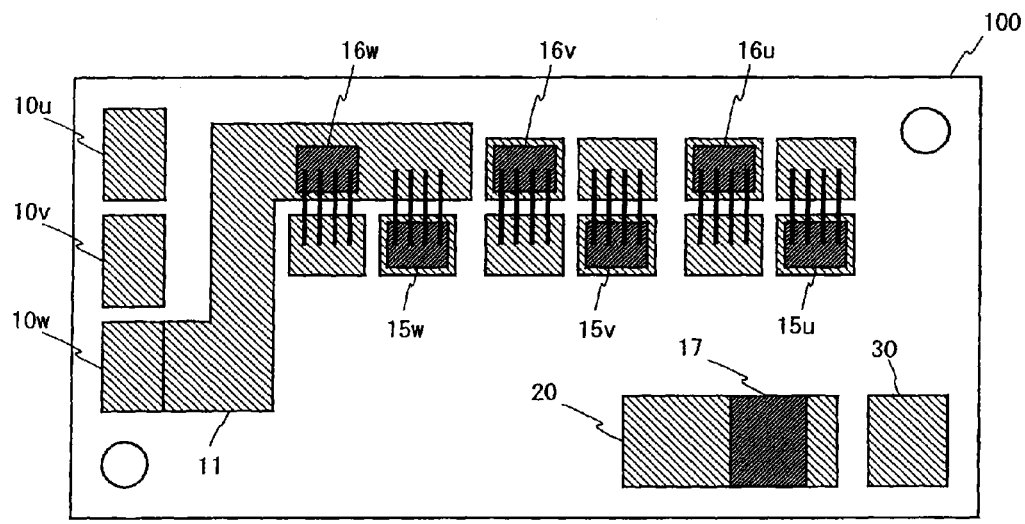
FIG. 1 An external plan view of a multilayer circuit board according to one embodiment of the invention.
Figure 2:
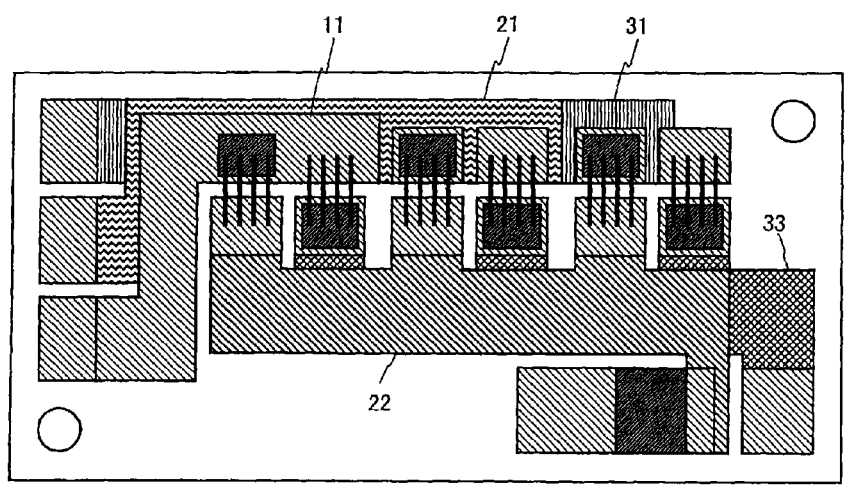
FIG. 2 An external plan view of the multilayer circuit board with those other than components and wirings which are included in the circuit board made transparent in the embodiment.
Figure 3:
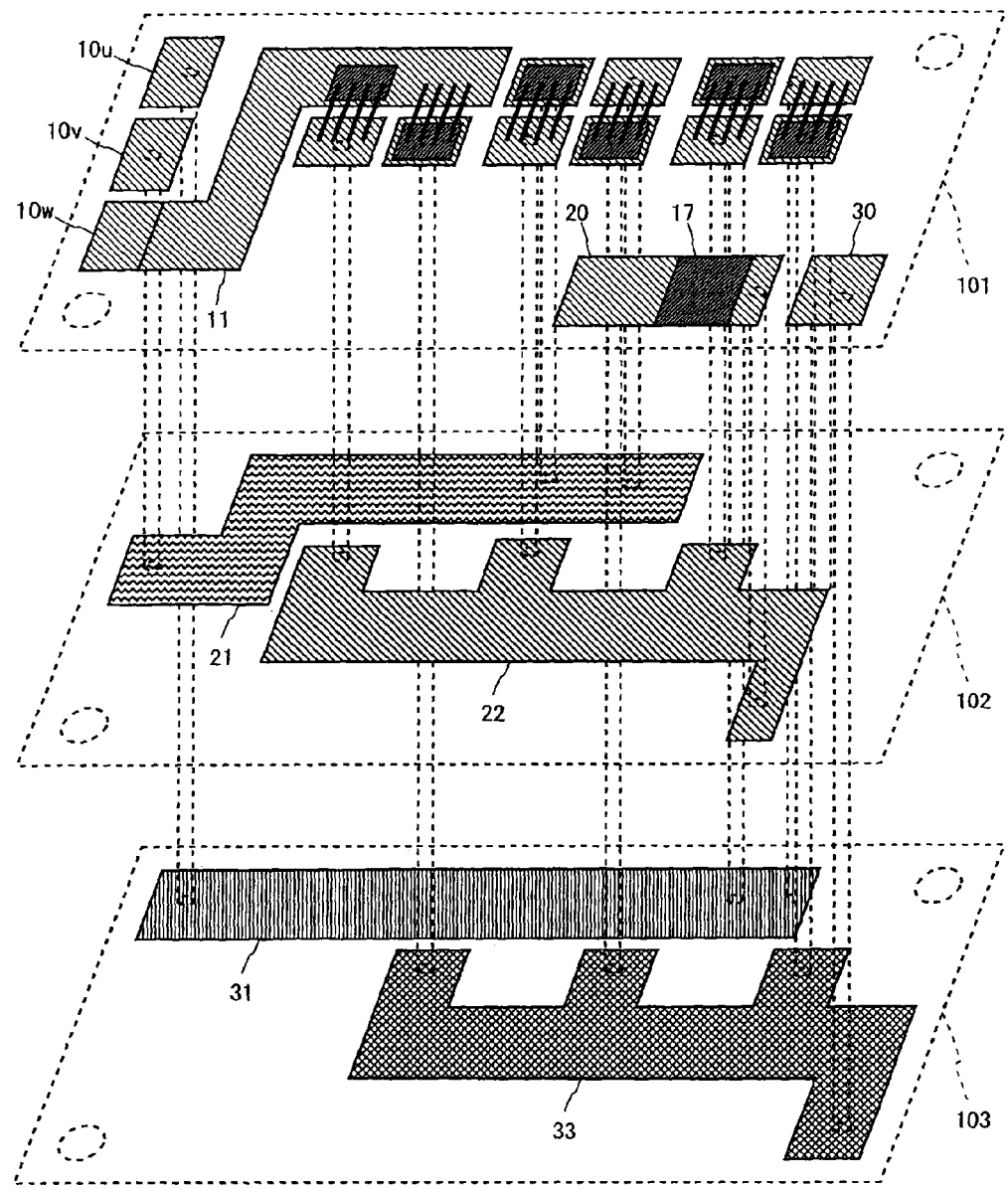
FIG. 3 An exploded perspective view showing respective constructions of layers of the multilayer circuit board according to the embodiment.

FIG. 1 is an external plan view of a multilayer circuit board according to one embodiment of the invention, FIG. 2 is an external plan view of the multilayer circuit board with those other than components and wirings which are included in the circuit board made transparent, and FIG. 3 is an exploded perspective view showing respective constructions of layers of the multilayer circuit board.

A multilayer circuit board 100 shown in these figures has a three-layer construction in which a first layer (a top layer) 101, a second layer 102 and a third layer 103, which are all conductor layers and insulation layers which are provided between those conductor layers are bonded together through thermocompression bonding. The conductor layers are made of metal such as copper having high conduction properties, and the insulation layers are made of a composite material (a so-called, prepreg) in which a glass fiber is impregnated with an insulation resin material. Screw holes are opened in a top right-hand corner and a bottom left-hand corner of the multilayer circuit board 100 as viewed in the figure so that the circuit board is screwed to an aluminum base or a heat sink.

A resistor 17 and six MOSFETs 15$u$, 15$v$, 15$w$, 16$u$, 16$v$, 16$w$ are placed on a top face of the multilayer circuit board 100. Connecting terminals at upper portions of these MOSFETs are connected individually to wiring conductors which are provided in predetermined positions on the first layer 101 with four aluminum wires through wire bonding. Further, a U-phase terminal 10$u$ which is connected to a U-phase input terminal, a V-phase terminal 10$v$ which is connected to a V-phase input terminal and a W-phase terminal 10$w$ which is connected to a W-phase input terminal of a steering assist motor, not shown, are provided on the first layer 101 of the multilayer circuit board 100. Furthermore, a W-phase wiring 11 which is linked to the W-phase terminal 10w, a ground terminal 20 which is linked to the resistor 17 and which is connected to a negative pole (a ground pole) provided in a power source unit, not shown, which lies outside the circuit board and a power source terminal 30 are provided on the first layer 101.

In addition to the MOSFETs 15u, 15v, 15w, 16u, 16v, 16w which are semiconductor chips and the resistor 17, electronic components that are to be mounted on the multilayer circuit board 100 which is the motor drive circuit board may include a current detection sensor, a noise removing coil, a power source interrupting relay, a motor phase current interrupting relay and the like.

Next, a ground wiring 22 which is linked to the ground terminal 20 on the first layer 101 and a V-phase wiring 21 which is linked to the V-phase terminal 10v on the first layer 101 are provided on the second layer 102 of the multilayer circuit board 100. In addition, a power source wiring 33 which is connected to the power source terminal 30 on the first layer 101 and a U-phase wiring 31 which is linked to the U-phase terminal 10u are provided on the third layer 103 of the multilayer circuit board 100.

Figure 4:
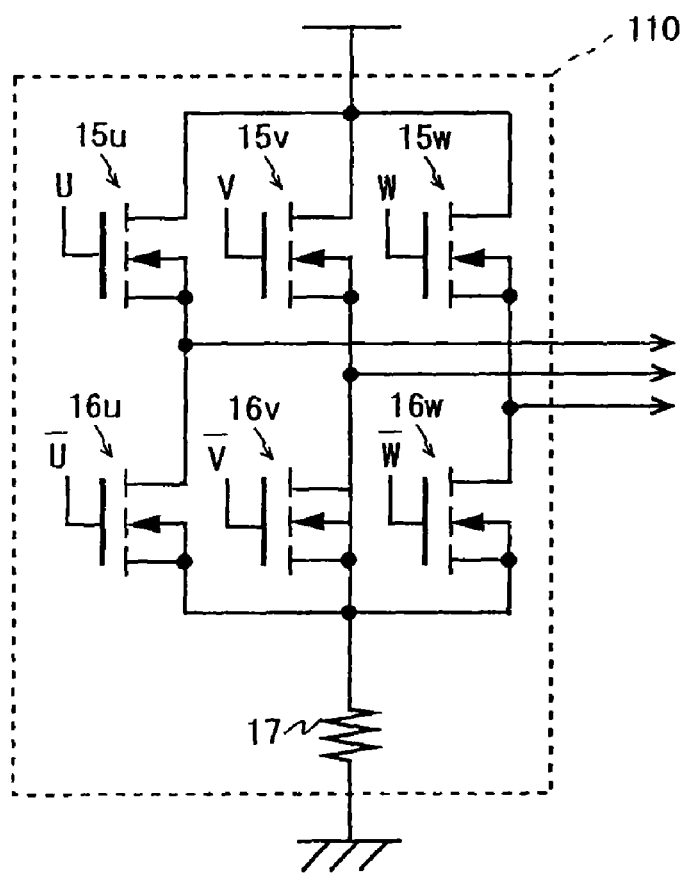
FIG. 4 A circuit diagram of a motor drive circuit of the embodiment.

Here, the configuration of the motor drive circuit will be described by reference to FIG. 4. FIG. 4 is a circuit diagram of the motor drive circuit. As is shown in FIG. 4, drain terminals of the MOSFETs 15u, 15v, 15w which are included in the motor drive circuit are connected to positive poles of the power source, not shown, and source terminals thereof are connected to the corresponding phase input terminals of the motor, respectively. Source terminals of the MOSFETs 16u, 16v, 16w which are included in the motor drive circuit are connected to the negative pole (the ground pole) of the power source, not shown, via the resistor 17, and drain terminals thereof are connected to the corresponding phase input terminals of the motor, respectively.

Referring to FIG. 3 in association with FIG. 4, it is seen that a connecting relationship of the motor drive circuit shown in FIG. 4 corresponds to a connecting relationship between the respective layers shown in FIG. 3. Namely, dotted lines extending in a vertical direction in FIG. 3 denote positions of through holes. Since conductor layers (typically, copper plated layers) are formed on inner faces of the through holes, energization or electrical communication is established between the conductors linked to both ends of the through holes. Consequently, as is shown in the circuit diagram in FIG. 4, the resistor 17 and the six MOSFETs 15u, 15v, 15w, 16u, 16v, 16w are connected by the through holes and the W-phase wiring 11, V-phase wiring 21, U-phase wiring 31, the ground wiring 22, and the power source wiring 33 which are shown in FIG. 3.

As is seen from FIGS. 2 and 3, in the wirings described above, the ground wiring 22 and the power source wiring 33 are disposed so that most of the wirings are superposed vertically. By this configuration, the inductance of these wirings is reduced. Namely, since the ground wiring 22 is connected to the ground terminal 20 in the vicinity of a rightward lower end portion in the figure (via the through hole and the resistor 17), a current flows therethrough from the right towards the left of the figure.

Consequently, the currents flow in an opposite direction to each other along the direction of the longer side in the portions of the ground wiring 22 and the power source wiring 33 which are superposed. Therefore, since magnetic fields generated by these currents are canceled by each other (namely, since a mutual inductance becomes large), the inductance of these wirings which generally extend long from the terminals can be reduced.

Similarly, in the wirings described above, the W-phase wiring 11, the V-phase wiring 21 and U-phase wiring 31 are also disposed so as to be superposed partially along the longer side direction of the multilayer circuit board 100. By this configuration, the inductance of these wirings is also reduced. Namely, when a general motor control is implemented, a sum of U-phase current, V-phase current and W-phase current becomes zero at all times. By this, magnetic fields generated by currents which flow along the longer side direction in the superposed portions of the W-phase wiring 11, V-phase wiring 21 and W-phase wiring 31 which are canceled by each other (the inductance becomes large). Consequently, the inductance of these wirings which tend to extend long from the terminals can be reduced in a similar fashion.

In this way, since even in the event that the length of the multilayer circuit board 100 is lengthened in the longer side direction, the inductance of the wirings can be suppressed, the length of the multilayer circuit board 100 in the longer side direction thereof can be made longer than the length in the shorter side direction to a significant extent, and the length of the multilayer circuit board 100 in the shorter side direction can be made smaller without changing the area thereof. Consequently, even in the event that a place where to install the multilayer circuit board 100 is narrow and long, the multilayer circuit board 100 can easily be installed (accommodated) therein.

When the multilayer circuit board 100 is installed (accommodated) in the narrow and long place, however, there is a case in which the position of the ground terminal 20 provided on the longer side of the multilayer circuit board 100 becomes a problem. This is because in certain circumstances, the wiring (the wire) cannot be laid to extend from the ground terminal 20 towards the shorter side direction of the multilayer circuit board 100 due to an obstacle lying along the longer side thereof. As this occurs, as is shown in FIGS. 5 and 6, a ground terminal 20 is preferably provided on a shorter side of a multilayer circuit board 110.

Figure 5:
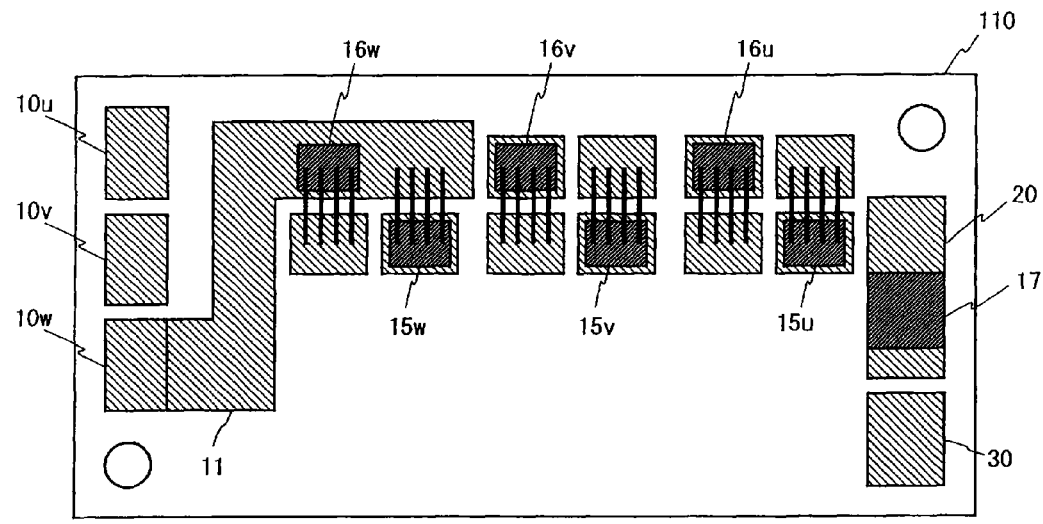
FIG. 5 An external plan view of a multilayer circuit board having another different configuration from the multilayer circuit board of the embodiment.

FIG. 5 is an external plan view of a multilayer circuit board which has another different configuration from the multilayer circuit board according to the embodiment. FIG. 6 is an external plan view of the multilayer circuit board having the other configuration with those other than components and wirings which are included in the circuit board made transparent.

Figure 6:
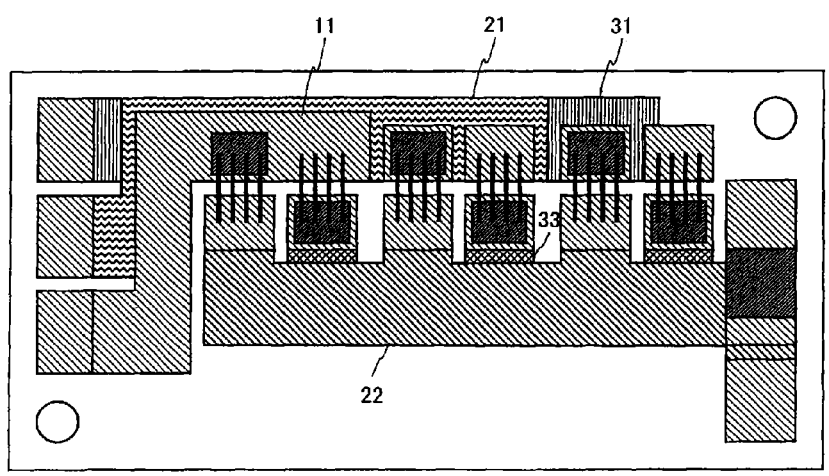
FIG. 6 An external plan view of the multilayer circuit board having the other configuration with those other than components and wirings which are included in the circuit board made transparent in the embodiment shown in FIG. 5.

As is seen when FIGS. 5 and 6 are referred to, in this multilayer circuit board 110, a ground terminal 20 and a resistor 17 are provided in different positions from those in the multilayer circuit board 100 shown in FIG. 2. Namely, in the multilayer circuit board 110 shown in FIGS. 5 and 6, the ground terminal 20 and a power source terminal 30 are provided in the vicinity of one of shorter sides thereof. In addition, a U-phase terminal 10u, a V-phase terminal 10v and a W-phase terminal 10w are provided in the vicinity of the other shorter side of the multilayer circuit board 110 in the same positions as those in the multilayer circuit board 100.

By the configuration in which the terminals to which wirings linked to external systems (here, the motor and the power source) are connected are provided only at the portions of the multilayer circuit board 110 which lie along the shorter sides thereof, even in the event that a place where to install (accommodate) the multilayer circuit board 110 is narrow and long along the longer side direction thereof, the multilayer circuit board 110 can easily be installed (accommodated) in the place without being interrupted by the wirings which are laid to extend from the respective terminals.

Figure 8:
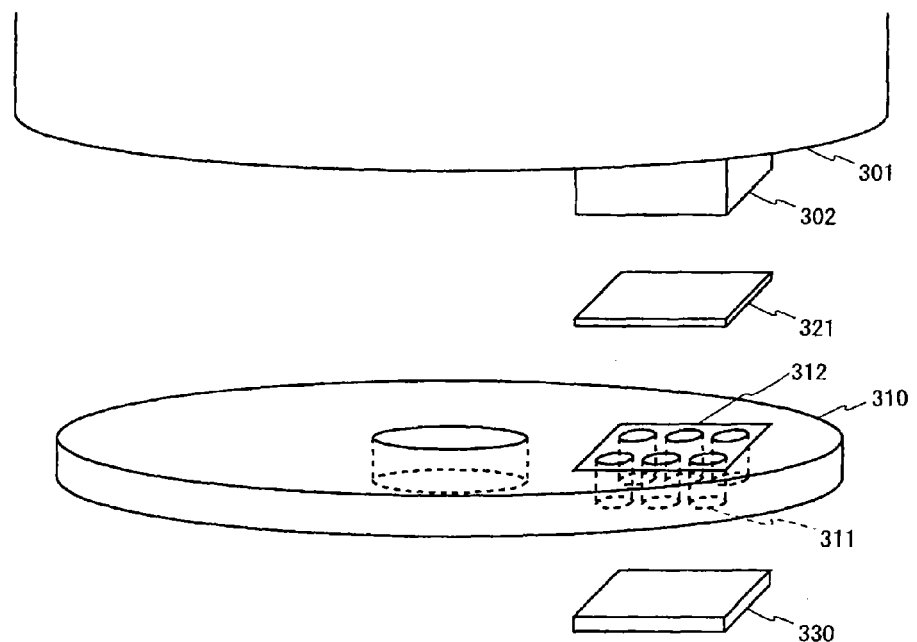
FIG. 8 An exploded perspective view showing schematically a construction for allowing heat of CPU to escape to a gear housing in the embodiment.

In the embodiment, while the multilayer circuit boards 100, 110 have the rectangular shape, the invention is not limited to the shape. For example, a generally rectangular shape may be adopted in which even though there are provided cutouts in edges thereof, the generally rectangular shape has four main sides. Alternatively, the multilayer circuit boards 100, 110 may have a shape as viewed from the top in which longer edges of the circuit board are curved along a predetermined circumference. Specifically, since in many cases, a motor drive circuit for driving a motor for use in an electric power steering system is accommodated within a cylindrical motor housing, a substrate of the motor drive circuit board may have a shape which corresponds to a circle which is a cross section of the motor housing or part thereof. As an example of a substrate like this, a doughnut-like shape as shown in FIG. 8, which will be described later, may be adopted. In the multilayer circuit board having the shape as viewed from the top in which the longer edges are curved along the predetermined circumference, a configuration can be thought of in which wirings extend along the circumference thereof. Even with this configuration, the inductance of the wirings which extend along the circumference can be reduced in the way described above. In addition, by the configuration in which the terminals to which the wirings linked to the external systems are connected are provided at the portions lying along the shorter edges of the circuit board which extend along a radial direction of the circumference, the multilayer circuit board can easily be installed (accommodated) within the cylindrical motor housing without being interrupted by the wirings which are laid to extend from the terminals.

The multilayer circuit boards 100, 110 are not necessarily limited to the motor drive circuit board. Further, as long as wirings are arranged so that magnetic fields generated by currents flowing therethrough are canceled by each other (the mutual inductance becomes large), the wirings are not necessarily limited to the combination of the ground wiring 22 and the power source wiring 33 or the combination of the W-phase wiring 11, the V-phase wiring 21 and the U-phase wiring 31.

2. Screwing Configuration of Heat Sink

Next, since the multilayer circuit boards 100, 110 which are the motor drive circuit boards and other circuit boards generate heat, in particular, when they control a large power, various devices for increasing the heat dissipating properties are made. Among them, a configuration in which a metallic substrate (which is, typically, made of aluminum) and a heat sink are screwed together is adopted in many cases since this configuration can suppress the fabrication costs. In this configuration, since a thin metallic substrate generally having a thickness of the order of 2 mm on which electronic components and circuit conductors are placed is screwed to a thick heat sink, a clearance (a gap) for screwing becomes necessary on a face (a top face) of the metallic substrate (on which the electronic components and the like are placed). However, this increases the face of the substrate, and depending upon screwing positions, the arrangement of the electronic components or the like on the metallic substrate may be difficult. As this occurs, the area of the substrate may have to be increased further. Then, by the screwing being implemented in a way shown in FIG. 7, the face of the substrate does not have to be so increased. Hereinafter, this will be described in detail by reference to FIG. 7.

Figure 7:
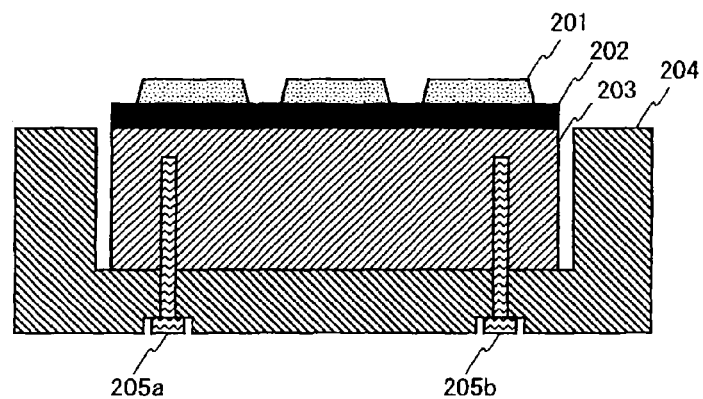
FIG. 7 A sectional view showing a metallic substrate and a heat sink which are screwed together so as to eliminate a clearance on a substrate surface in the embodiment.

FIG. 7 is a sectional view showing a metallic substrate and a heat sink which are screwed together so that no clearance is necessary on a face of the substrate. As is shown in FIG. 7, although (electronic components, not shown, and) circuit conductors 201 (typically, made of copper) are disposed on a face (a top face) of a metallic substrate 203 via an insulation layer 202, a clearance for screws 205a, 205b is made unnecessary. Namely, the metallic substrate 203 is made thicker than a normal one, and tappings (holes) for screwing are formed at predetermined portions thereof, and spot facing is provided on a heat sink 204 so that the metallic substrate 203 is accommodated therein. The metallic substrate 203 is accommodated in the spot-faced portion, and the screws 205a, 205b are passed through the tappings formed in the metallic substrate and inserted into tappings formed in the heat sink 204 from a rear side (a lower side) of the heat sink 204 which is an opposite side to a contact side thereof, so as to screw the metallic substrate 203 and the heat sink 204 together.

By adopting this configuration, since a clearance on the face of the substrate becomes unnecessary, the area of the face of the substrate can be reduced. In addition, since the metallic substrate 203 is allowed to be accommodated in the spot-faced portion, even in the event that the metallic substrate 203 is thick, an increase in the overall thickness of the circuit board including the heat sink 204 can be suppressed. However, as long as the metallic substrate 203 has an enough thickness for tappings for screwing to be formed therein, the metallic substrate 203 may be relatively thin. As this occurs, a case can be considered in which the spot facing is unnecessary. However, when the spot facing is made unnecessary, since the mounting strength is reduced, in the event that a certain mounting strength is required, the metallic substrate 203 needs to be made thick. As this occurs, it is preferable that the heat sink 204 is spot-faced as shown in FIG. 7.

In FIG. 7, while the so-called single layer substrate is illustrated in which the circuit conductors 201 and the like are formed on the metallic substrate 203 with the single insulation layer 202 interposed therebetween, in place of this, a multilayer circuit board such as the multilayer circuit boards 100, 110 described above may be used.

3. Heat Dissipating Configuration for CPU

Following what has been described above, in addition to heat dissipation by the heat sink described above, further heat dissipation is preferably applied particularly to the CPU incorporated in the ECU used in the electric power steering system for control. Although an ECU used in a column assisting electric power steering system is generally provided in the vicinity of a power steering assist motor in many cases, the ECU is subjected to influence by heat generated by the motor due to the arrangement. Then, an ECU used in a pinion assisting electric power steering system is installed in a position which lies away from a steering assist motor and is connected to the motor by a wiring harness in many cases. In recent years, however, in many cases, an ECU is accommodated within a housing of a motor (and a gear) from the viewpoint of making the ECU smaller in size and highly efficient in performance. As this occurs, a sufficient heat dissipating measure needs to be secured for the CPU which generates heat largely. Then, heat generated from the CPU can be dissipated sufficiently in a secured fashion by a configuration shown in FIG. 8 in which heat generated by the CPU is dissipated to a gear housing having a large heat capacity. Hereinafter, this will be described in detail by reference to FIG. 8.

FIG. 8 is an exploded perspective view showing schematically a configuration for allowing heat of the CPU to escape to the gear housing. In a control circuit board 310 shown in FIG. 8, a CPU 330, electronic components and circuit conductors are disposed on a lower side thereof as viewed in the figure, and the control circuit board 310 has a doughnut-like shape. A shaft of a steering assist motor, not shown, passes through an opening in the vicinity of a center of the control circuit board 310 in a vertical direction relative to a face of the substrate. The control circuit board 310 is formed to match a cylindrical shape of the motor and has a shape which follows a circle which is a cross-sectional shape of the cylindrical shape of the motor so as to be accommodated within a housing of the motor efficiently in terms of space. The whole or part of this control circuit board may be made up of the multilayer circuit boards 100, 110.

Here, the CPU 330 has a metallic heat dissipating portion, and a heat sink, not shown, is attached to a face (a lower face in the figure) thereof. In addition to this, with a view to enabling heat to be dissipated from a rear face (an upper side face in the figure) of the CPU 300, heat dissipating through holes 311 are formed in a land (an area) where the CPU 330 is attached. These heat dissipating through holes 311 are such that conductor layers plated with such as copper are formed on inner faces of holes which penetrate from the land (the area) to which the CPU 330 is attached to a land for dissipating heat (hereinafter, referred to as a "heat dissipating land") (which is a copper plated portion) 312 formed on a rear face (an upper face in the figure) of the control circuit board 310, and resin is filled in interiors of the holes. Heat of the CPU 330 is transferred to the heat dissipating land 312 by the heat dissipating through holes 311.

This heat dissipating land 312 is brought into press contact with a projecting portion 302 which is formed underneath an upper gear housing 301 via a heat conduction sheet 321. By this configuration, heat of the CPU 330 is transferred to the upper gear housing 301 having a large heat capacity. By this, the heat of the CPU 330 is dissipated with good efficiency. A configuration may be adopted in which in place of the heat conduction sheet 321, a gel containing a material having heat conduction properties may be applied. The CPU 330 has been described as representing an element having a large heat capacity, and this heat dissipating configuration may be applied to other electronic components. For example, the configuration in question may be adopted for the MOSFETs 15u, 15v, 15w, 16u, 16v, 16w which are provided on the multilayer circuit boards 100, 110 described above.

4. Heat Dissipating Configuration for Circuit Board

Figure 9:
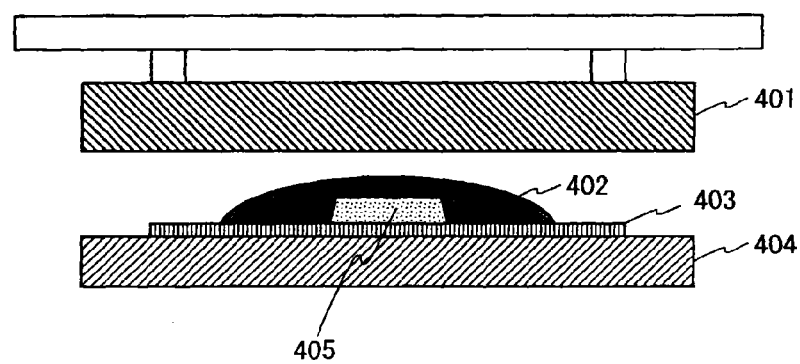
FIG. 9 A schematic sectional view showing constructions of a bare chip and a non-contacting heat sink in the embodiment.
Figure 10:
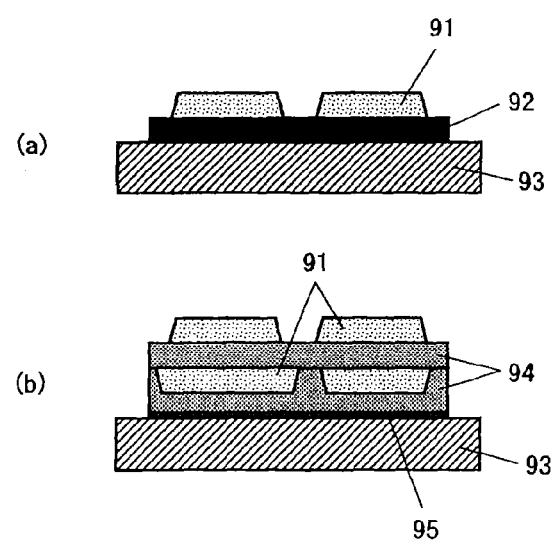
FIG. 10 A sectional view of a conventional circuit board.

As has been described above, although there are various methods for dissipating heat from the electronic components on the circuit board, in the case of the electronic component being a bare chip, a heat sink cannot be attached directly to the bare chip. Then, it is a general configuration in which a heat sink is attached to a circuit board on which the bare chip is mounted. However, there is a tendency that the quantity of heat conducted from a circuit board to a heat sink is reduced as circuit boards are made smaller in size. With insufficient heat dissipating efficiency, there is a possibility that an abnormal operation or destruction of the bare chip takes place due to heat imposed thereon. Then, a configuration can be considered in which the efficiency with which heat is dissipated from the bare chip is increased by providing a new non-contacting heat sink as is shown in FIG. 9. Hereinafter, the configuration will be described in detail by reference to FIG. 9.

FIG. 9 is a schematic sectional view showing configurations of a bare chip and a non-contacting heat sink. As is shown in FIG. 9, a bare chip 450 is mounted on an electronic circuit board 403, and a normal heat sink 404 is attached to a rear face (a lower face in the figure) of the electronic circuit board 403. A coating resin 402 is applied to the periphery of the bare chip 405, and a non-contacting heat sink 401 is disposed directly above the bare chip 405 in a closest position so as to face the bare chip 405. This non-contacting heat sink 401 is fixed to a housing having a larger heat capacity.

By adopting this configuration, since heat from the bare chip 405 is transferred to the non-contacting heat sink 401 via the coating resin 402 by heat radiation or heat conduction via air, in addition to the heat dissipating effect by the normal heat sink 404, the heat dissipating efficiency of heat from the bare chip 405 can be increased further. By this, the electronic circuit board 403 can be made smaller in size without increasing the heat load borne by the bare chip 405. In addition, the non-contacting heat sink 401 can be mounted and controlled easily, and the coating resin 402, which will be described later, is inexpensive, and therefore, the heat dissipating efficiency can be increased without involving large fabricating costs for addition of the configuration described above.

Here, in order to increase the heat dissipating efficiency by heat radiation, the non-coating heat sink 401 and the coating resin 402 are preferably black in color. In particular, the coating resin 402 may be a black insulation material or a material containing a known black paint. In place of these materials or together with the materials, a material containing a substance (for example, a ceramic mainly containing aluminum oxide) with high radiation efficiency may be used as the coating resin 402.

Although the heat dissipating efficiency is reduced, it is possible to omit the non-contacting heat sink 401. As this occurs, heat dissipation is implemented by heat from the coating resin 402 having high radiation efficiency being dissipated to the atmosphere (and further to the peripheral members). Although the shorter the distance between the coating resin 402 and the non-contacting heat sink 401, the higher the heat dissipating efficiency, there is a possibility that in case the distance is too short, a physical force is applied to the bare chip 405 to thereby be destroyed. Because of this, it is preferable to set a space between the coating resin 402 and the non-contacting heat sink 401 to be near at least something like a distance in which the heat conduction effect by heat radiation is interrupted by the heat insulation effect by air.

5. Advantage

As has been described heretofore, in the multilayer circuit board 100 in the embodiment, since the wirings are arranged so that the magnetic fields are cancelled by each other, the inductance of the wirings can be reduced. In addition, the switching noise that is generated thereby can be suppressed to a lower level. Further, since the inductance of the wirings is small, the circuit board can be lengthened in the direction in which the wirings extend.

The invention is based on Japanese Patent Application (No. 2008-028111) filed on Feb. 7, 2008, the contents of which are incorporated herein by reference.

INDUSTRIAL APPLICABILITY

The invention can provide the multilayer circuit board in which the wirings are arranged so that the inductance thereof is reduced and a motor drive circuit board employing the multilayer circuit board which is used in an electric power steering system.

The invention claimed is:

1. A multilayer circuit board including a plurality of conductor layers and a plurality of resin insulation layers which are laminated alternately, comprising:
   a first wiring formed on a first layer of the plurality of conductor layers;
   a second wiring formed on a second layer of the plurality of conductor layers;
   a third wiring formed on a third layer of the plurality of conductor layers,
   wherein portions of the first wiring and the second wiring which face each other in a laminated direction in which the plurality of conductor layers are laminated extend in parallel;
   wherein the first wiring and the second wiring are arranged so as to weaken a magnetic field generated by a current which flows through the first wiring and a magnetic field generated by a current which flows through the second wiring to each other;
   wherein the first wiring and the second wiring are a power source wiring and a ground wiring in which currents flow therethrough in an opposite direction to each other; and
   wherein the first wiring, the second wiring, and the third wiring are respectively connected to phases of a multiphase motor provided outside.

2. The multilayer circuit board according to claim 1, wherein the first wiring, the second wiring, and the third wiring are respectively connected to the phases of the multiphase motor via a U-phase wiring, a V-phase wiring, and a W-phase wiring;
   wherein an FET, a ground terminal, and a power source terminal are provided on the third layer;
   wherein the ground wiring formed on the second layer is connected to the ground terminal via a through hole of the third layer;
   wherein the power source wiring formed on the first layer is connected to the power source terminal via a through hole of the second layer;
   wherein the U-phase wiring, the V-phase wiring, and the W-phase wiring have layer shapes, and are provided on the first layer, the second layer, and the third layer, respectively; and
   wherein portions of the U-phase wiring, the V-phase wiring and the W-phase wiring are superposed in the laminated direction of the plurality of conductor layers.

3. The multilayer circuit board according to claim 1, further comprising:
   a terminal provided in a vicinity of at least one of two short edges of four edges of a substrate surface which is configured by curved lines or straight lines, and is connected to at least one of the first wiring and the second wiring,
   wherein the portions of the first wiring and the second wiring which face each other extend along two long edges of the four edges.

4. A motor drive circuit board for an electric power steering system, comprising:
   a multilayer circuit board which includes a plurality of conductor layers and a plurality of resin insulation layers, the conductor layers and the resin insulation layers being laminated alternately;
   a first wiring formed on a first layer of the plurality of conductor layers;
   a second wiring formed on a second layer of the plurality of conductor layers; and
   a third wiring formed on a third layer of the plurality of conductor layers,
   wherein portions of the first wiring and the second wiring which face each other in a laminated direction in which the plurality of conductor layers are laminated extend in parallel;
   wherein the first wiring and the second wiring are arranged so as to weaken a magnetic field generated by a current which flows through the first wiring and a magnetic field generated by a current which flows through the second wiring to each other;
   wherein the first wiring and the second wiring are a power source wiring and a ground wiring in which currents flow therethrough in an opposite direction to each other; and
   wherein the first wiring, the second wiring, and the third wiring are respectively connected to phases of a multiphase motor provided outside.

5. The motor drive circuit board according to claim 4, wherein the first wiring, the second wiring, and the third wiring are respectively connected to the phases of the multiphase motor via a U-phase wiring, a V-phase wiring, and a W-phase wiring;
   wherein an FET, a ground terminal, and a power source terminal are provided on the third layer;
   wherein the ground wiring formed on the second layer is connected to the ground terminal via a through hole of the third layer;
   wherein the power source wiring formed on the first layer is connected to the power source terminal via a through hole of the second layer;
   wherein the U-phase wiring, the V-phase wiring, and the W-phase wiring have layer shapes, and are provided on the first layer, the second layer, and the third layer, respectively; and
   wherein portions of the U-phase wiring, the V-phase wiring, and the W-phase wiring are superposed in the laminated direction of the plurality of conductor layers.

* * * * *